(12) United States Patent
Sitaraman et al.

(10) Patent No.: US 8,766,449 B2
(45) Date of Patent: Jul. 1, 2014

(54) VARIABLE INTERCONNECT GEOMETRY FOR ELECTRONIC PACKAGES AND FABRICATION METHODS

(75) Inventors: Suresh K. Sitaraman, Atlanta, GA (US); Karan Kacker, Atlanta, GA (US); Thomas Sokol, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1754 days.

(21) Appl. No.: 11/805,693

(22) Filed: May 24, 2007

(65) Prior Publication Data

US 2008/0245559 A1    Oct. 9, 2008

Related U.S. Application Data

(60) Provisional application No. 60/809,508, filed on May 31, 2006.

(51) Int. Cl.
*H01L 23/532* (2006.01)

(52) U.S. Cl.
USPC ........... 257/773; 257/758; 257/759; 257/760; 257/E21.581; 257/E21.589; 257/E23.144; 257/E23.167; 438/619; 438/622; 438/623; 438/624

(58) Field of Classification Search
USPC .................. 257/758–760, E21.581, E21.589, 257/E23.144, E23.167, 773; 438/619, 438/622–624, 739–740, 319
See application file for complete search history.

(56) References Cited

U.S. PATENT DOCUMENTS

| | | | | |
|---|---|---|---|---|
| 4,988,413 A * | 1/1991 | Chakravorty et al. | ........ | 205/118 |
| 6,333,255 B1 * | 12/2001 | Sekiguchi | ...................... | 438/622 |
| 7,507,656 B2 * | 3/2009 | Chen | .............................. | 438/619 |
| 2002/0118515 A1 * | 8/2002 | Zhu et al. | ...................... | 361/728 |
| 2004/0051173 A1 * | 3/2004 | Koh et al. | ...................... | 257/728 |

* cited by examiner

*Primary Examiner* — Ermias Woldegeorgis
(74) *Attorney, Agent, or Firm* — Thomas|Horstemeyer, LLP.

(57) ABSTRACT

Disclosed is a variable interconnect geometry formed on a substrate that allows for increased electrical performance of the interconnects without compromising mechanical reliability. The compliance of the interconnects varies from the center of the substrate to edges of the substrate. The variation in compliance can either be step-wise or continuous. Exemplary low-compliance interconnects include columnar interconnects and exemplary high-compliance interconnects include helix interconnects. A cost-effective implementation using batch fabrication of the interconnects at a wafer level through sequential lithography and electroplating processes may be employed.

6 Claims, 8 Drawing Sheets

Column interconnects

Low compliance helix interconnects

High compliance helix interconnects

Fig. 7d
High compliance helix interconnects

Fig. 7b
Column interconnects

Fig. 7c
Low compliance helix interconnects

VARIABLE INTERCONNECT GEOMETRY FOR ELECTRONIC PACKAGES AND FABRICATION METHODS

This application claims the benefit of U.S. Provisional Application No. 60/809,508, filed May 31, 2006.

STATEMENT REGARDING FEDERALLY SPONSORED RESEARCH OR DEVELOPMENT

This invention was made with government support under agreement ECS-0539023 awarded by the National Science Foundation. The government has certain rights in the invention.

CROSS REFERENCE TO RELATED APPLICATIONS

This application claims priority to U.S. provisional application entitled "Variable interconnect geometry with optimal electrical and mechanical properties for electronic packages" having Ser. No. 60/809,508, filed May 31, 2006.

BACKGROUND

The present invention relates generally to using a variable interconnect geometry for first/second level interconnects in electronic packages, and methods for implementing the same.

Power and latency are fast becoming major bottlenecks in the design of high performance microprocessors and computers. Power relates to both consumption and dissipation, and therefore, effective power distribution design and thermal management solutions are required. Latency is caused by the global interconnects on an integrated circuit (IC) that span at least half a chip edge due to the RC and transmission line delay. Limits to chip power dissipation and power density and limits on hyper-pipelining in microprocessors threaten to impede the exponential growth in microprocessor performance. In contrast, multi-core processors can continue to provide a historical performance growth on most consumer and business applications provided that the power efficiency of the cores stays within reasonable power budgets. To sustain the dramatic performance growth, a rapid increase in the number of cores per die and a corresponding growth in off-chip bandwidth are required. Furthermore, to reduce the RC and transmission line delay, low-K dielectric/Cu and ultra-low-K dielectric/Cu interconnects on silicon will become increasingly common. In such ICs, the thermo-mechanical stresses induced by the chip-to-substrate interconnects could crack or delaminate the dielectric material causing reliability problems. On the other hand using a compliant structure as an off-chip interconnect allows for isolation of the die from the substrate. Therefore they would not crack or delaminate the low-K dielectric. However a compliant structure would have lower electrical performance. To address this, keeping in perspective the mechanical requirements, I/O customization could be utilized. This would allow off-chip interconnects to address the increasing demands on their electrical performance.

Conventional electronic packages typically include interconnects that are nearly identical in shape and size from the center to the edge. Flip chip solder bumps, BGA solder balls and CSP interconnects are some of the examples. However, as one moves from the center to the edge of a package or a chip, the differential expansion due to coefficient of thermal expansion (CTE) mismatch (between chip and board or chip and interposer/substrate or package and board) increases. Hence, the choice of the interconnect design is such that the interconnect at the furthest distance from the center of the die, where the differential displacement between the die and the substrate due to CTE mismatch is maximum, has sufficient fatigue life and will not delaminate or crack the low-K dielectric in the die.

It would be desirable to have improved packaging techniques and methods and utilize a step wise or continuous variation of interconnect geometry in an electronic package. This would improve the electrical performance of electronic packages without compromising on mechanical reliability.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 2a-2h illustrate fabrication of exemplary interconnects;

FIGS. 3a-3c illustrates an exemplary design of a layer 1 mask for the fabrication process described with reference to FIG. 2a-2h;

FIGS. 4a-4c illustrates an exemplary design of a layer 2 mask for the fabrication process described with reference to FIGS. 2a-2h;

FIGS. 5a-5c illustrates an exemplary design of a layer 3 mask for the fabrication process described with reference to FIGS. 2a-2h;

FIGS. 6a-6c illustrates an exemplary design of a combined layer 1-3 mask for the fabrication process described with reference to FIGS. 2a-2h; and FIGS. 7a-7d, 8a and 8b are enlarged SEM pictures showing a fabricated heterogeneous interconnects at a 100 μm pitch for the fabrication process described with reference to FIGS. 2-6.

DETAILED DESCRIPTION

Disclosed herein is an interconnect scheme for use in IC package or substrate fabrication wherein compliance and/or the design of the interconnects varies for a given package. The variance in compliance can be achieved by varying the design of the interconnect. The variance in compliance may also be achieved by utilizing different materials for the interconnects. The compliance can very from the center to the edge of the die. The variation in compliance (e.g., by variation in interconnect geometry) can either be step-wise or continuous. An exemplary implementation process is also disclosed. In one implementation, interconnects near the center have low and/or medium compliance (where differential expansion is at a minimum), while interconnects near the edge have high compliance (where differential expansion is at a maximum).

In this exemplary implementation, the interconnects that are near the center of die have reduced compliance, where differential displacement between the die and the substrate due to the coefficient of thermal expansion (CTE) mismatch is low, will neither fatigue fail nor exert excessive force on the low-K dielectric to crack or to delaminate. By varying the design of the interconnects from the center of the die to the edge of the die, the electrical performance of the system can be improved without compromising thermo-mechanical reliability.

For example, different shaped interconnects may be provided in an electronic package or an integrated circuit chip such that the compliance of the interconnects vary from the center to the edge. Other types of varying compliance from center to the edge is also possible depending on the needs of the application.

Typically, electrical parasitics change directly with mechanical compliance. Thus, when an interconnect is designed to have high mechanical compliance, the electrical parasitics also increase. The heterogeneous or varying compliance interconnect system disclosed herein can be tailored such that the interconnects near the center can be designed with low and/or medium compliance and can be used low electrical parasitic interconnects (such as ground and power). The interconnects near the edge may be designed with high compliance and can be used for signal interconnects. Also, the high compliance interconnects will exert minimal force on the die so that they will not crack or delaminate the low-K dielectrics in current and future dies. By placing the highly-compliant interconnects near the edge, the fatigue life of the interconnects can also be enhanced, as these interconnects are able to accommodate the differential expansion due to CTE mismatch between the die and the substrate, between the package and the board, or between the die and the board. These are some of the example illustrations of potential applications of the varying compliance interconnects. Other applications are also possible.

To implement the concept in a cost-effective manner, the interconnects may be batch fabricated at the wafer level by sequential lithography and electroplating processes. The lithographic processes define a mold into which the interconnect material is electroplated. As lithographic processes are used to define the interconnect geometry, implementing different interconnect geometries is not at the expense of an increased number of fabrication steps and hence relatively cost-effective. Interconnects towards the center of the die may be configured to have a columnar structure and hence a lower compliance. Interconnects fabricated away from the center of the die may employ variations of a compliant interconnect design, such as is described in U.S. Pat. No. 6,784, 3780, for example, with a higher compliance than the column interconnects. The contents of U.S. Pat. No. 6,784,3780 are incorporated herein in its entirety by reference.

Variable Interconnect Implementation

To implement the concept in a cost-effective manner, the interconnects may be batch fabricated at the wafer level by sequential lithography and electroplating processes. The lithographic processes define a mold into which the interconnect material is electroplated. As lithographic processes are used to define the interconnect geometry, implementing different interconnect geometries is not at the expense of an increased number of fabrication steps and hence are relatively cost-effective.

The interconnects at the center of the die may be fabricated in the shape of a column structure, while the interconnects near the edge of the die can be fabricated with the compliant interconnect structure described under Example 1 in U.S. Pat. No. 6,784,378, issued to Zhu, et al., entitled "Compliant Off-chip Interconnects", hereafter referred to as a helix (or helical) interconnect. The three-mask process described in Example 1 in U.S. Pat. No. 6,784,378 may be used to create interconnects that vary in shape from the center to the edge of the die: from column to low-compliant and/or medium-compliant helix interconnects to high-compliant helix interconnects, and still maintaining the required pitch through the entire array. This would represent a step-wise variation in interconnect geometry. A continuous variation in interconnect geometry is also possible. The central columns are beneficial from a number of perspectives: (1) they can be used predominantly as ground-power interconnects with the ability to carry higher current, (2) they can provide high enough rigidity against potential vibration or drop induced damage on the compliant interconnects, and (3) they can act as a stopper to prevent damage to the interconnects when an excessive force is inadvertently applied either during assembly and/or when a heat sink is attached. Since these columns are located near the center of the die where CTE-induced differential thermal expansion is low, these columns will not fatigue fail or exert excessive force on the low-K dielectric to cause cracking or delamination.

The interconnects away from the center of the die are fabricated with increasing magnitude of compliance as one traverses to the corner/edge of the die. Near the corner/edge of the die, the CTE-induced differential thermal deformation is high, and therefore, higher compliance is needed to reduce the force induced on die pads by the interconnect. The interconnects in the middle of the die can have reduced compliance and still will not delaminate or crack the low-K dielectric. When the mechanical compliance is low (by variation of the helix interconnect geometry), the electrical parasitics will improve, and thus the system performance can be tailored by balancing electrical requirements against thermo-mechanical reliability concerns. As is described in U.S. Pat. No. 6,784, 378, the helix interconnect geometry comprises a first freestanding arcuate structure that is substantially parallel to the substrate, and which is curved in a plane substantially parallel to the substrate.

Figure 1:
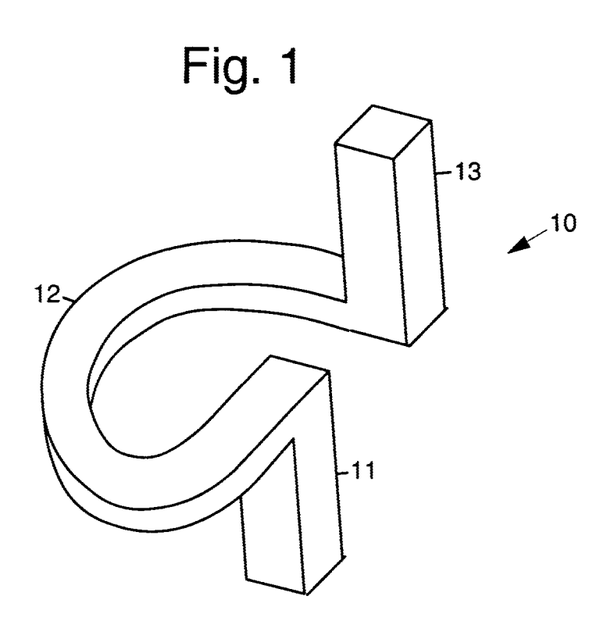
FIG. 1 illustrates a schematic representation of an exemplary variable interconnect concept.
Figure 7A:
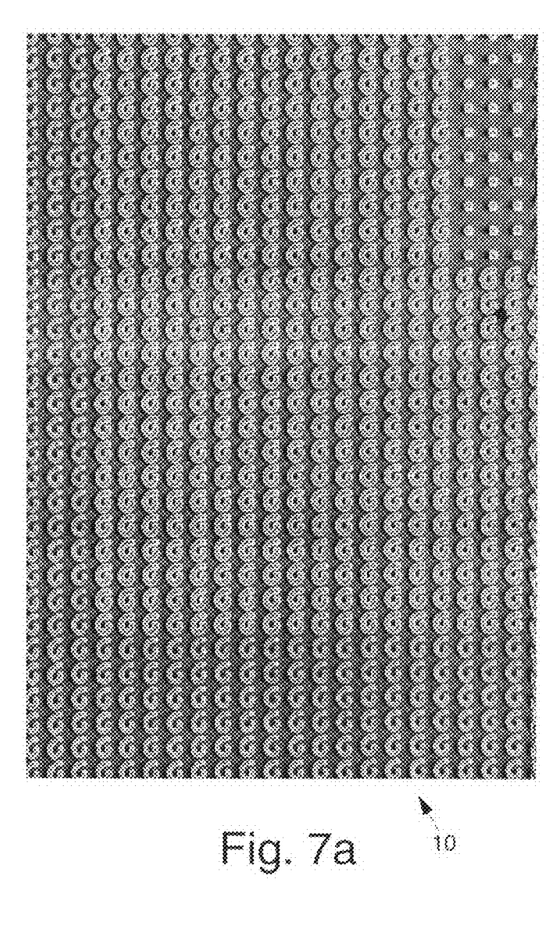
Figure 7B:
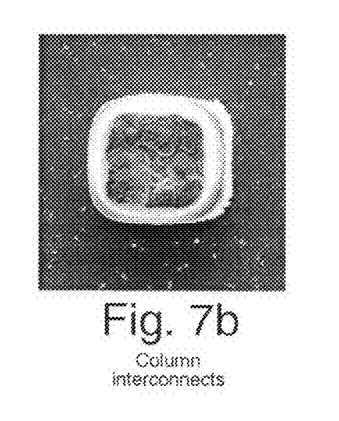
Figure 7C:
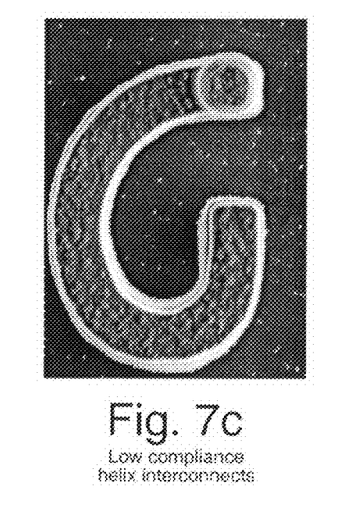
Figure 7D:
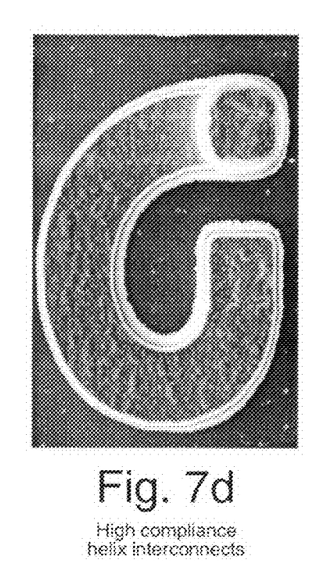

Referring to the drawing figures, illustration of an exemplary implementation of the variable interconnect concept is disclosed. FIG. 1 shows an exemplary compliant interconnect 10. The exemplary compliant interconnect 10, comprises a bottom post 11, a top post 13, and an arcuate beam structure 12. The bottom post, the arcuate beam and the top post together describe a helix-type compliant interconnect. The arcuate structure is substantially parallel to a substrate on which it is disposed, and is curved in a plane substantially parallel to the substrate. The width, beam radius and/or thickness (i.e. the parameters that define the interconnect design) of the helix interconnect 12 can be varied to create structures having different compliance. FIG. 7a, for example, shows a plurality of exemplary interconnects 10, whose compliance varies from the center of a substrate 21 to the edge of the substrate 21.

Interconnect Fabrication

An exemplary fabrication process 20 or procedure to realize the interconnect geometries such as is shown in FIG. 1 is described below. A fabrication procedure similar to that described with regards to Example 1 in U.S. Pat. No. 6,784, 378 is extended to implement different interconnect geometries within a single package in a cost-effective manner. The exemplary fabrication process 20 is illustrated in FIGS. 2a-2h.

Figure 2A:
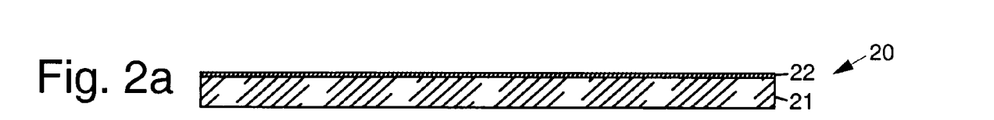
Figure 2B:
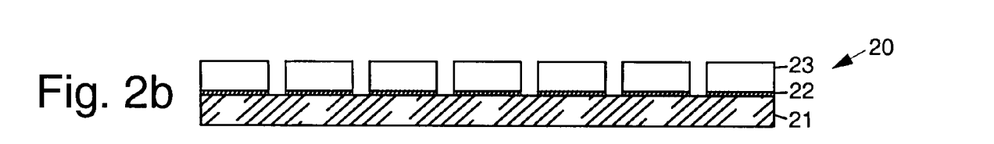
Figure 2C:
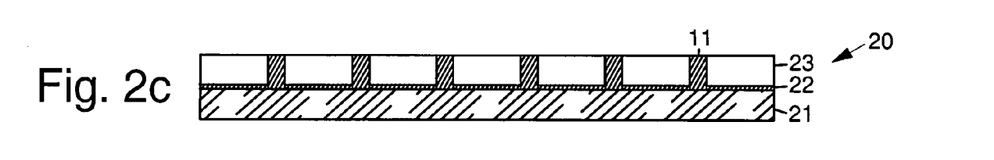

To begin fabrication, and as shown in FIG. 2a, on a clean wafer 21, a seed layer 22 (for example Ti/Cu/Ti) is sputter deposited. The seed layer could be used to enhance adhesion between the layer below and the layer above, that is deposited later. The seed layer could be any metal or composite. In this example, the bottom and the top Ti layers are present to improve adhesion between wafer/Cu and Cu/applied photoresist interfaces. After the seed layer 22 is deposited, as is shown in FIG. 2b, a thick photoresist 23 can be spun and used to define a first layer mold for a bottom post 11. The thick photoresist can be replaced by any material which can be patterned to determine the first layer mold. As shown in FIG.

Figure 2D:
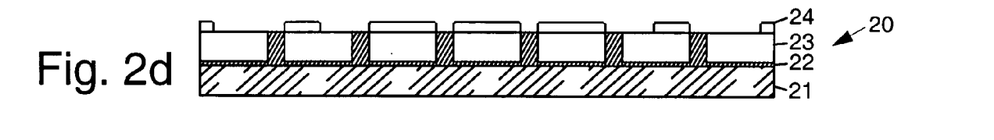
Figure 2E:
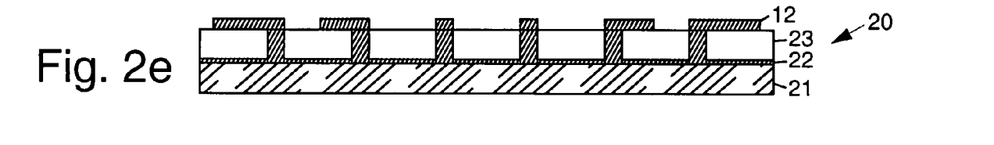
Figure 2F:
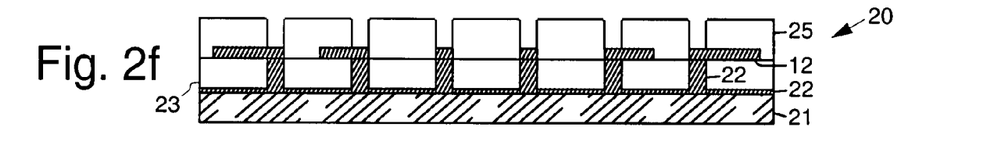
Figure 2G:
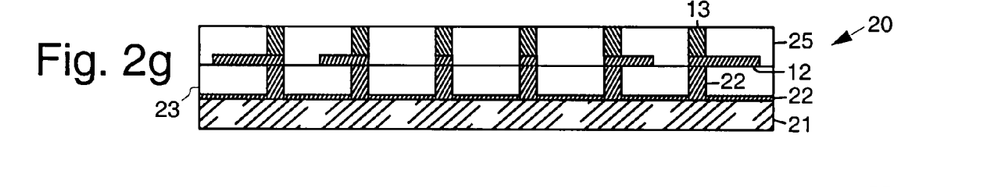
Figure 2H:
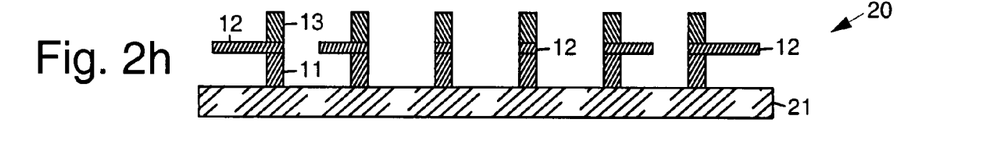
Figure 3A:
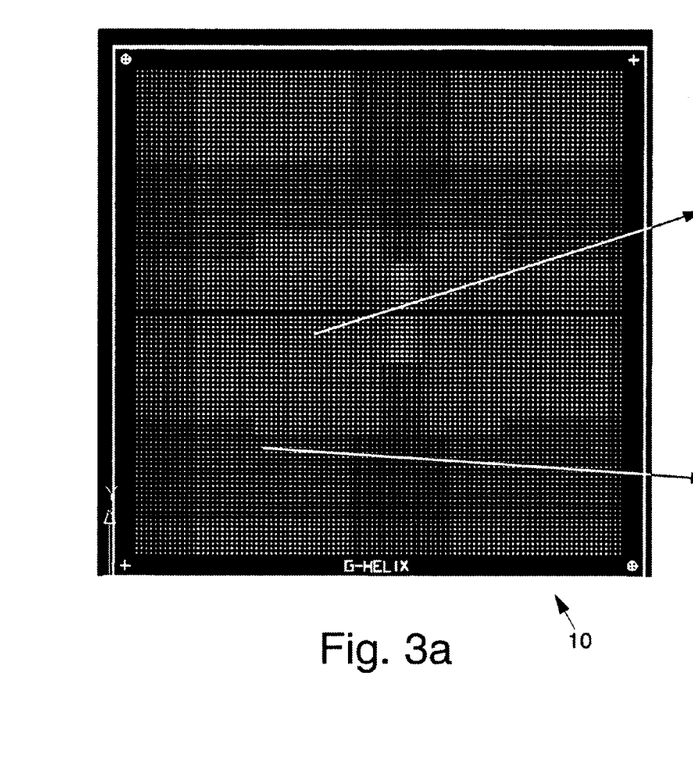
Figure 3B:
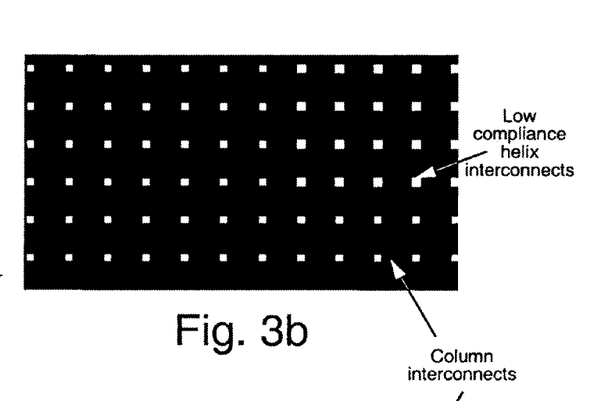
Figure 3C:
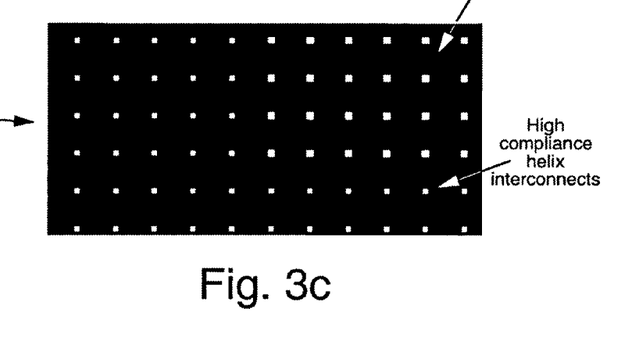
Figure 4A:
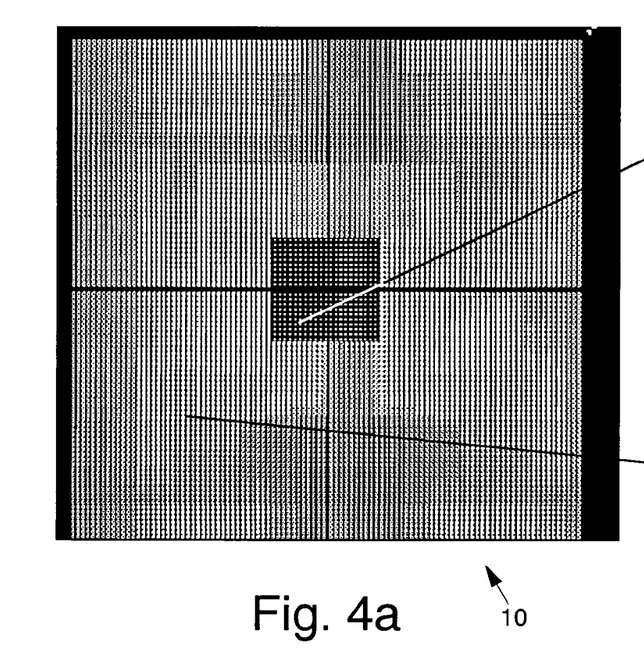
Figure 4B:
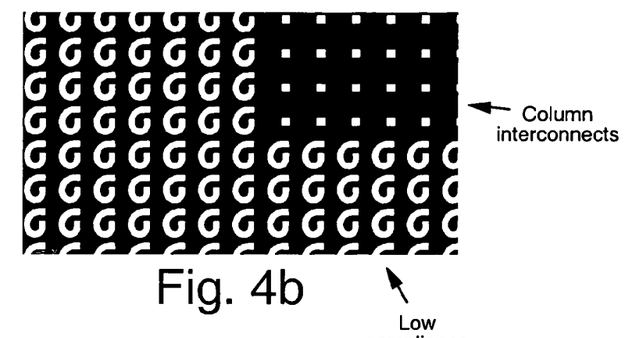
Figure 4C:
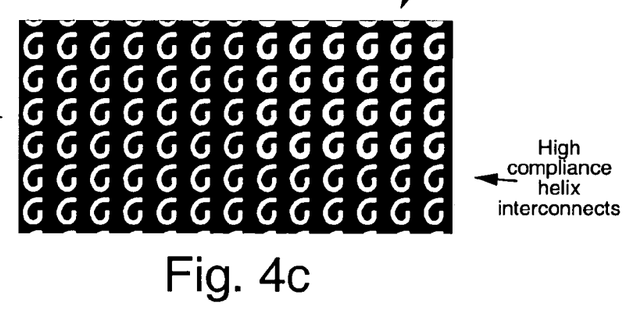
Figure 5A:
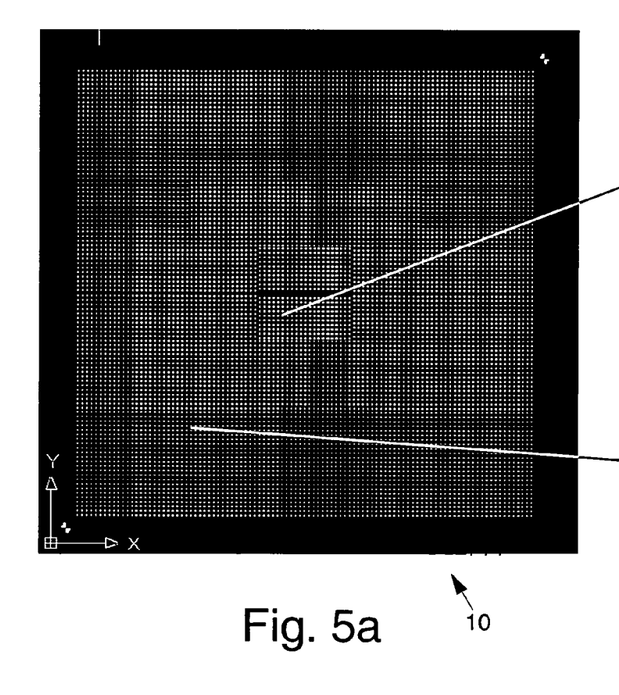
Figure 5B:
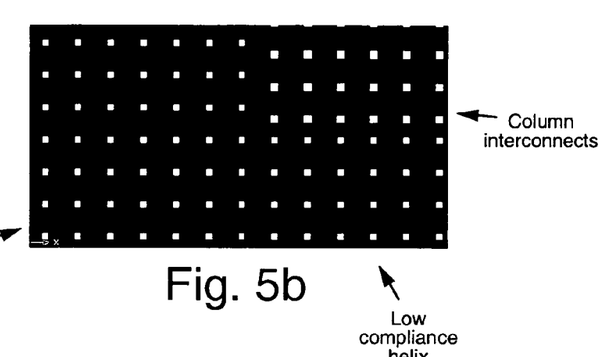
Figure 5C:
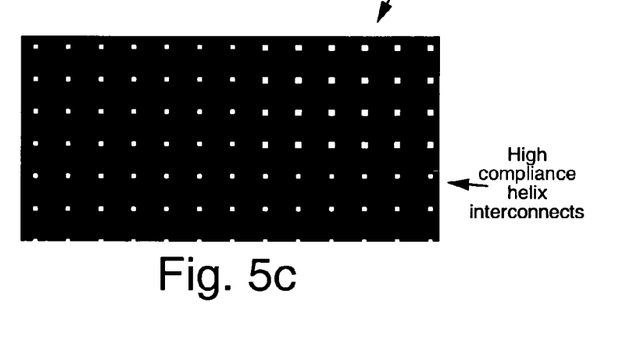

2c, material for the bottom post 11 can be deposited. A suitable deposition process can be utilized. For example, copper could be electroplated into the mold. As shown in FIG. 2d, after depositing the material for the bottom post 11, a second seed layer (not shown) could be deposited and suitable material 24 to define the second layer post can be deposited. For example, a layer of photoresist 24 (for example, NR9-8000p) may be spun (deposited). The second layer defines different mold geometries for the different types of interconnects 10. As shown in FIG. 2e, interconnects 10 having different compliance values are then be deposited (for example by electroplating). More particularly, the second layer can be deposited to define an arcuate beam structure 12 for the helix interconnect 10 and extend the column interconnect 10, and the second mold layer 24 is removed. As shown in FIGS. 2f and 2g, the sequential process of mold definition (for example by photolithography) and deposition (for example by electroplating) can be repeated to create the top post 13 for the interconnects. A thicker layer of the mold material 25 (for example NR9-8000p photoresist) can be used for this layer. In FIG. 2f, a third layer mold could be defined, and in FIG. 2g, the top post 13 is depositing (for example by electroplated copper). Once the steps are completed, as shown in FIG. 2h, the surrounding mold material 23, 25 and seed layers 22, can be removed (for example by etching to release (create) the free-standing wafer-level interconnect 10. As is shown in FIG. 2h, the interconnect 10 include column interconnects 11, 13, low/medium compliance helix interconnects 12 and high compliance helix interconnects 12 disposed on the substrate 21.

Figure 8A:
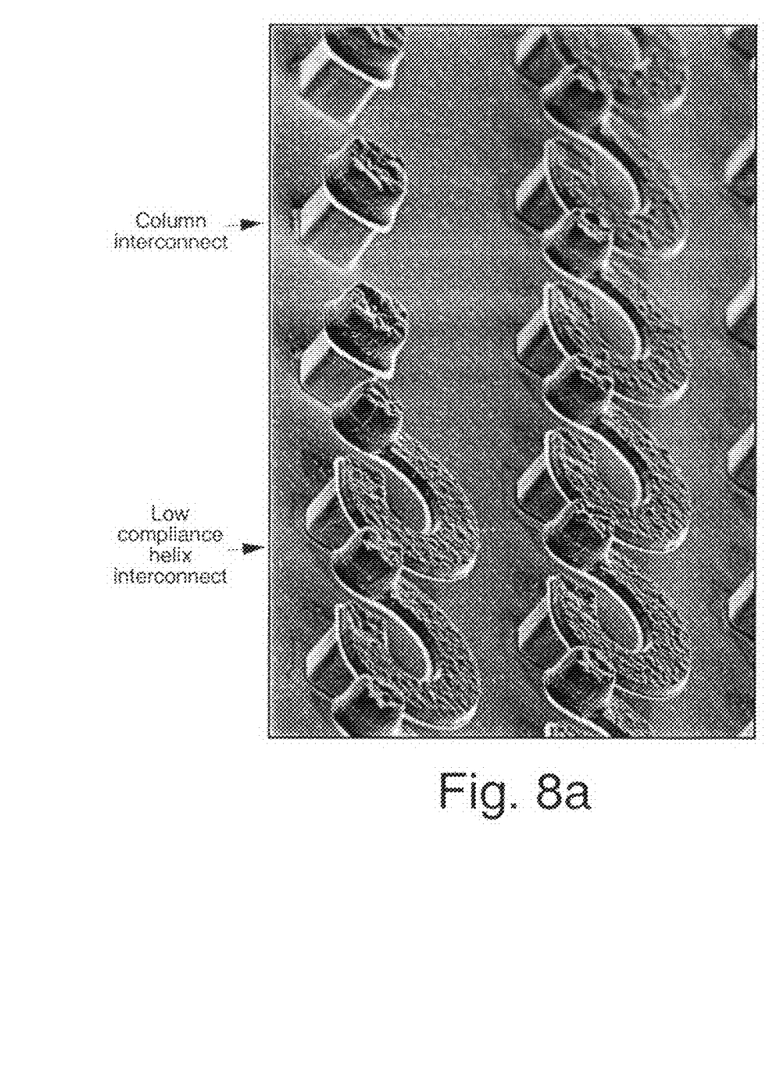
Figure 8B:
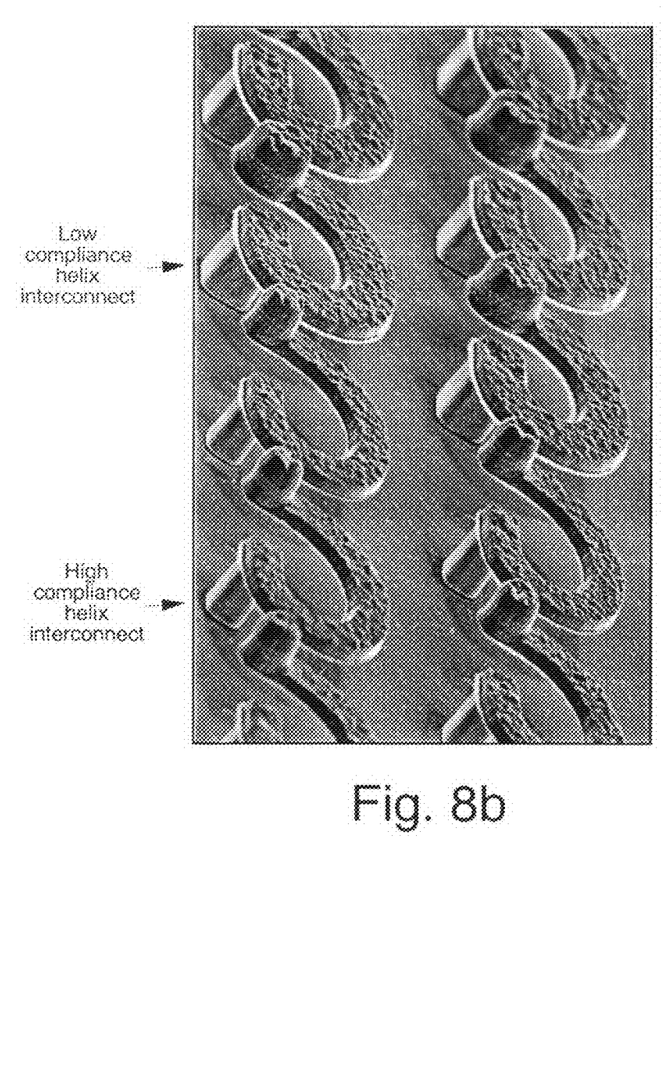

Preliminary fabrication of the test dies with heterogeneous interconnects 10 has been performed on a 4 inch diameter silicon wafer. Fabricated interconnects 10 corresponding to the mask designs shown in FIGS. 4-7, are shown in FIGS. 8a and 8b. In the SEM micrograph shown in FIGS. 8a and 8b, column interconnects 10 visible towards the center of the die (top right corner of micrograph) and the helix interconnects 10 are seen in the remaining region.

Thus, instead of employing a single interconnect geometry as is conventionally done, a variable interconnect geometry as disclosed herein allows for increased electrical performance of the interconnects without compromising the mechanical reliability of the wafer/substrate. A cost-effective implementation of the concept using batch fabrication of the interconnects 10 at a wafer level through sequential lithography and electroplating processes may be employed.

Utilizing a column-like structure for the interconnects 10 at the center of die has additional advantages. This provided for the ability to carry higher current by using the column interconnects 10 predominantly as ground-power interconnects. The column interconnects 10 can provide high enough rigidity against potential vibration or drop-induced damage on the helix interconnects 10. Furthermore, the column interconnects 10 can act as a stopper to prevent damage when an excessive force is inadvertently applied either during assembly and/or when a heat sink is attached.

Although the above embodiments have been discussed with respect to chip on substrate/board, the concepts disclosed herein may also be used with BGA, CSP, and other packages, where package-to-board interconnects can have varying compliance from the center to the edge. Fabrication steps may be readily modified accordingly on a substrate (instead of a silicon wafer) to build package-to-board interconnects with varying compliance.

Mask Design for the Heterogeneous Interconnects

Additional details regarding the mask design for the heterogeneous interconnects 10 will now be discussed. To implement the concept in a cost-effective manner, the interconnects 10 can be batch fabricated at the wafer level using the above-discussed three-mask process using sequential lithography and electroplating processes. The lithographic processes define a mold into which the interconnect material is electroplated. Because lithographic processes are used to define the interconnect geometry, implementing different interconnect geometries is not at the expense of an increased number of fabrication steps and hence is relatively cost-effective.

In implementing the concept described above, the interconnects 10 at the center of the die are fabricated in the shape of a column structure, while the interconnects 10 near the edge of the die are fabricated with the compliant interconnect structure (helix interconnect) described with regards to Example 1 in U.S. Pat. No. 6,784,378. The three-mask process described under Example 1 in U.S. Pat. No. 6,784,378 is used to create interconnects 10 that vary in shape from the center to the edge of the die: from column to low-compliant and/or medium-compliant helix interconnects to high-compliant helix interconnects, and still maintaining the required pitch through the entire array.

Figure 6A:
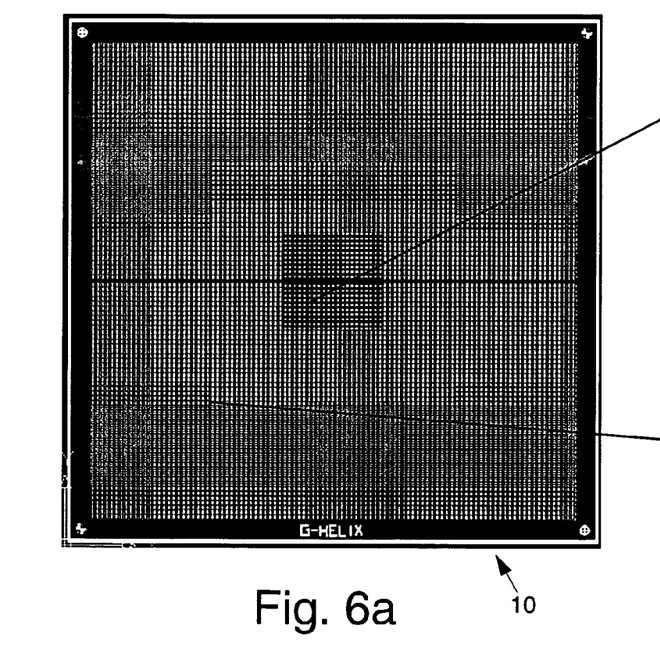
Figure 6B:
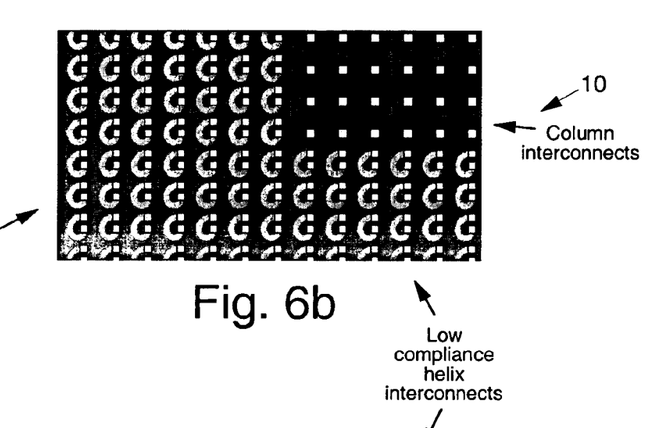
Figure 6C:
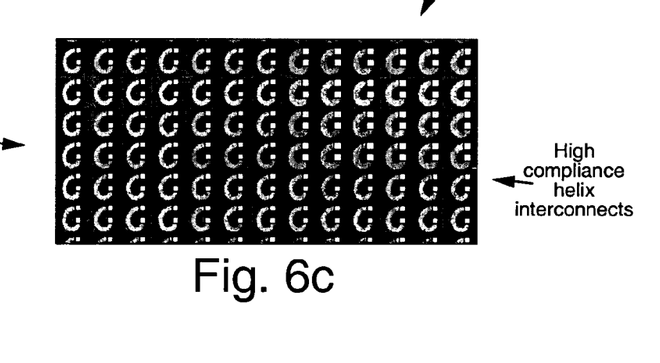

Mask designs for the three lithographic steps used to fabricate this implementation of the varying compliance concept are shown in FIGS. 3a-3c, 4a-4c, and 5a-5c. The mask designs correspond to a 10 mm by 10 mm chip with interconnects 10 at a 100 μm pitch. The first layer mask (FIGS. 3a-3c) defines post with different cross-sectional areas. Posts with the largest cross-sectional area are towards the center of the die and correspond to the column interconnects 10. The posts with the smallest cross-sectional area are towards the edge of the die and correspond to the high compliance helix interconnects. The intermediate region is occupied with posts of intermediate cross-sectional area and corresponds to the low-compliance helix interconnects 10. The second layer mask (FIGS. 4a-4c) defines the different interconnect geometries, posts for the column interconnects 10 and arcuate beams for the helix interconnects. The third layer mask (FIGS. 5a-5c) is similar to that of the first layer, except that the posts are offset for the helix interconnects 10. FIG. 6a-6c shows the three mask layers shown in FIGS. 3a-3c, 4a-4c, and 5a-5c superimposed.

Using the process illustrated in FIG. 2, a heterogeneous combination of interconnects 10 was fabricated on a bare silicon die. The 3-mask fabrication process utilizes suitable mask designs to simultaneously realize the different interconnect geometries. The fabricated structures are shown in FIGS. 7a-7d, 8a and 8b. As seen in FIGS. 7a-7d, column interconnects 10 are present at the center of the die, high compliant interconnects 10 are present towards the edge and low-compliant interconnects are present in the intermediate region. FIGS. 8a and 8b show additional images of these fabricated structures. FIG. 8a shows a combination of column and low-compliant helix interconnects 10. FIG. 8b shows a combination of high-compliant helix and low-compliant helix interconnects 10.

Thus, a variable interconnect geometry for use in fabricating electronic packages, and methods for fabricating such packages have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A method comprising
providing a substrate;
forming a first mold on the substrate that defines bottom posts of a plurality of free-standing interconnects;

forming bottom posts using the first mold;
forming a second mold above the first mold that defines a plurality of different mold geometries corresponding to a plurality of interconnects whose compliance varies from a center of the substrate to edges of the substrate;
forming the plurality of interconnects whose compliance varies from the center of the substrate to edges of the substrate using the second mold;
forming a third mold above the second mold that defines a top post of each of the plurality of free-standing interconnects;
forming top posts for each of the interconnects using the third mold;
removing the molds to create free-standing interconnects;
wherein forming the second mold comprises depositing a second seed layer and depositing a second layer of photoresist to define the plurality of different mold geometries comprising column interconnects and helix interconnects;
wherein forming the third mold comprises depositing a third seed layer and depositing a third layer of photoresist on the third seed layer to define the third mold;
and wherein the free-standing interconnects include column interconnects, low/medium compliance helix interconnects and high compliance helix interconnects disposed on the substrate.

2. The method recited in claim 1, wherein forming the first mold comprises:
depositing a first seed layer on the substrate; and
depositing a first layer of photoresist on the seed layer to define the first mold.

3. The method recited in claim 2, further comprising:
etching away a part of the first seed layer; and
electroplating the bottom posts.

4. The method recited in claim 3, further comprising:
etching away a top layer of the second seed layer;
electroplating the interconnects whose compliance varies from the center of the substrate to the edge of the substrate; and
removing the second layer of photoresist.

5. The method recited in claim 4, wherein the interconnects whose compliance varies are electroplated to define arcuate beam structures for the helix interconnects and extend the column interconnects.

6. The method recited in claim 4, further comprising:
etching away a top layer of the third seed layer;
electroplating the top posts; and
removing the third layer of photoresist to create the free-standing interconnects.

* * * * *